United States Patent

Ayela et al.

[11] Patent Number: 5,956,582
[45] Date of Patent: Sep. 21, 1999

[54] CURRENT LIMITING CIRCUIT WITH CONTINUOUS METALLIZATION

[75] Inventors: Christophe Ayela, Tours; Philippe Leturcq, Auzielle; Jean Jalade, Castanet Tolasan; Jean-Louis Sanchez, Escalquens, all of France

[73] Assignee: SGS-Thomson Microelectronics S.A., Saint Genis, France

[21] Appl. No.: 08/874,217

[22] Filed: Jun. 13, 1997

Related U.S. Application Data

[62] Division of application No. 08/240,029, May 9, 1994.

[30] Foreign Application Priority Data

May 10, 1993 [FR] France ................................ 93 05886

[51] Int. Cl.⁶ .......................... H01L 29/76; H01L 29/94; H01L 31/062; H01L 31/113
[52] U.S. Cl. .......................... 438/206; 438/273; 438/942; 257/328; 257/329; 257/340; 257/341; 257/402
[58] Field of Search ...................... 257/328, 340, 257/341, 360, 361, 402, 403, 329; 438/942, 206, 273

[56] References Cited

U.S. PATENT DOCUMENTS

| | | | |
|---|---|---|---|
| 3,603,811 | 9/1971 | Day | 307/237 |
| 4,148,047 | 4/1979 | Hendrickson | 357/23 |
| 4,303,935 | 12/1981 | Ragaly | 357/76 |
| 4,376,286 | 3/1983 | Lidow et al. | 257/341 |
| 4,764,480 | 8/1988 | Vora | 257/370 |
| 4,902,636 | 2/1990 | Akiyama et al. | 437/45 |
| 5,055,895 | 10/1991 | Akiyama et al. | 357/23.4 |
| 5,165,973 | 11/1992 | Kojima et al. | 428/331 |
| 5,191,279 | 3/1993 | Zommer | 323/354 |
| 5,289,028 | 2/1994 | Clark et al. | 257/355 |
| 5,352,915 | 10/1994 | Hutchings et al. | 257/361 |
| 5,629,536 | 5/1997 | Heminger et al. | 257/173 |

FOREIGN PATENT DOCUMENTS

| | | | |
|---|---|---|---|
| 2 641 417 | 7/1990 | France | H01L 29/68 |
| 58-100460 | 6/1983 | Japan | H01L 29/78 |
| 61-137368 | 6/1986 | Japan | H01L 29/78 |
| 2-128474 | 6/1990 | Japan | H01L 29/78 |

OTHER PUBLICATIONS

French Search Report from French patent application No. 9305886, filed May 10, 1993.

*FETs Provide Current Limiting for Protection Against Shorts*, 2328 Electronic Design; vol. 24, No. 12, Jun. 7, 1976, p. 160.

*Primary Examiner*—William Mintel
*Attorney, Agent, or Firm*—Wolf, Greenfield & Sacks, P.C.

[57] ABSTRACT

A two-terminal current limiting component, includes a substrate of a first conductivity type; separated wells of the second conductivity type; a first annular region of the first conductivity type in each well; a second annular region of the first conductivity type having a low doping level between the periphery of each first annular region and the periphery of each well; an insulating layer over the second annular region and the surface portions of the substrate; a first metallization coating the upper surface of the component; and a second metallization coating the lower surface of the component.

7 Claims, 5 Drawing Sheets

CURRENT LIMITING CIRCUIT WITH CONTINUOUS METALLIZATION

This application is a division of application Ser. No. 08/240,029, filed May 9, 1994, entitled CURRENT LIMITING CIRCUIT and now pending.

BACKGROUND OF THE INVENTION

1. Field of the Invention

The present invention relates to a current limiting circuit.

2. Discussion of the Related Art

Generally, two types of circuits for protecting a load against overcurrents are used. The most common protection method consists in disposing a clipping or breakover voltage limiting circuit in parallel with the load. However, in some cases, series circuits are desired. Such circuits are seldom used because, when they are fabricated in the form of semiconductor components, they generally require a current or voltage detection device and a separate control device. Therefore, such protection circuits are devices provided with a control terminal that has to be associated with rather complex control circuits. Two-terminal series components mainly include fuses or varistors. The drawback of fuses is that they must be replaced after each overload. Varistors are presently expensive components having a threshold that is not always precisely determined and is environment-dependent (more particularly, temperature-dependent). Additionally, a varistor unavoidably exhibits a thermal inertia and, for example, does not ensure protection against overcurrents occurring very shortly one after the other.

It has also been proposed to use depleted MOS transistors as current limiting components, the first terminal of the current limiting component being formed by interconnection of the gate and source terminals of the transistor, and the second terminal of the current limiting component being formed by the drain terminal of the transistor. This approach is for example described in U.S. Pat. No. 3,603,811 filed on Dec. 9, 1969. However, the above patent mentions this approach only to emphasize its drawbacks and, hitherto, such a device has not been implemented in any practical application.

The invention relates to a series protection circuit that is not intended for protection against a short in a load but against temporary overcurrents, for example, overcurrents that occur at the switching-on of a fluorescent lamp. The invention also applies when the protection threshold is comprised within a very large range, for example, from a few tens of milliamperes to several amperes.

The conventional drawing of a current limiting circuit is illustrated in FIG. 1; it merely consists of disposing in series with a load L a current limiting component 1. Of course, it is also desired that, when the current in load L has a normal value, the impedance of the current limiting component be as low as possible.

SUMMARY OF THE INVENTION

An object of the present invention is to provide a simple and inexpensive current limiting component.

Another object of the invention is to provide a current limiting component whose limiting current is little temperature-dependent.

A further object of the invention is to provide a bidirectional current limiting component.

To achieve these objects, and such other objects as will be apparent to those skilled in the art, one aspect of the invention provides the use of a vertical depleted MOS or IGBT transistor in which the gate and source electrodes are formed by a single metallization as a series current limiting component.

More particularly, another aspect of the invention provides a two-terminal current limiting component, including a substrate of a first conductivity type; separated wells of the second conductivity type formed in the upper surface of the substrate; a first annular region of the first conductivity type with a high doping level in each well; a second low doped, shallow, annular region of the first conductivity type between the inner periphery of each first annular region and the periphery of each well; an insulating layer coating the second annular region and the surface portions of the substrate between the wells; a first metallization coating the upper surface of the component; and a second metallization coating the lower surface of the component.

An embodiment of the invention further includes a first highly doped peripheral region of the first conductivity type, and a second inner peripheral region, separated from the first peripheral region by an area of the substrate, said second low doped peripheral region being of the second conductivity type.

Another embodiment of the invention includes a central highly doped region of the second conductivity type.

According to another embodiment of the invention, the central region of each separated well is more highly doped than the peripheral portion.

According to a further embodiment of the invention, the two-terminal component includes, on the lower surface of the substrate, the same wells, regions and layer, thereby constituting a bidirectional current limiting component.

According to yet another embodiment of the invention, the component is solder-bonded between two heat sinks.

The present invention also may include a method for manufacturing the above-described two-terminal component.

More generally, the invention may be embodied in an electronic circuit that includes in series with a possible overcurrent source a vertical depleted MOS or IGBT transistor having interconnected source and gate.

The foregoing and other objects, features, aspects and advantages of the invention will become apparent from the following detailed description of the present invention when taken in conjunction with the accompanying drawings.

As conventional in integrated circuit representation, it will be noted that the various drawings are not drawn to scale, and in particular, in the cross-sectional views, the thicknesses of the various layers are arbitrarily drawn to facilitate legibility. Also, in the cross-sectional views, the shapes of the diffused regions are schematically drawn.

DETAILED DESCRIPTION

Figure 1:
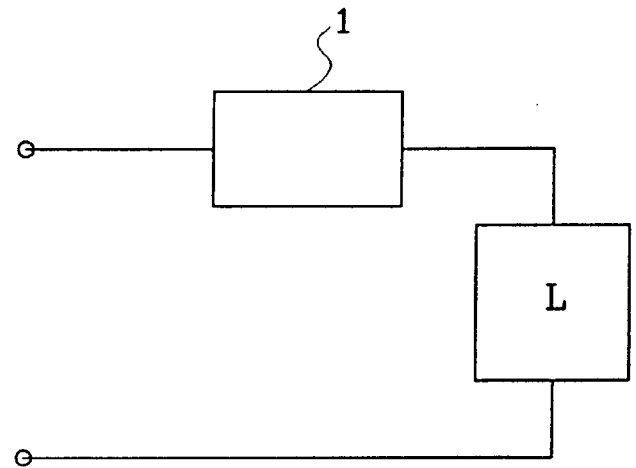
FIG. 1, above described, illustrates the conventional circuit of a series current limiting component.
Figure 2:
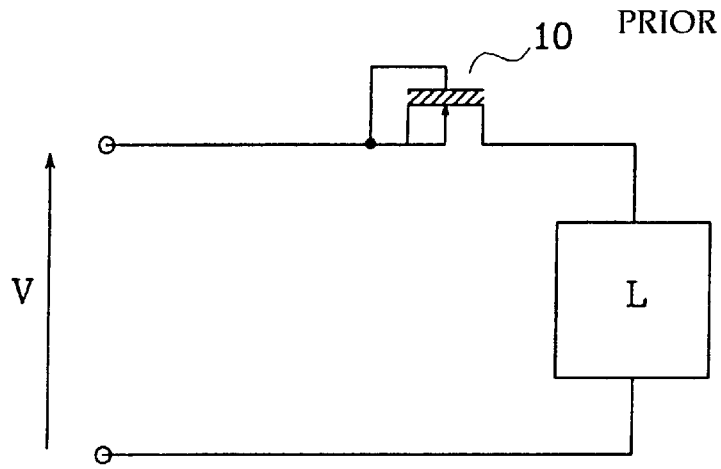
FIG. 2 represents a circuit including a current limiting component of the depleted MOS transistor type.

FIG. 2 represents a circuit including a load L and a current limiting component 10. Component 10 is a simple depleted MOS transistor having its gate connected to its source.

Figure 3:
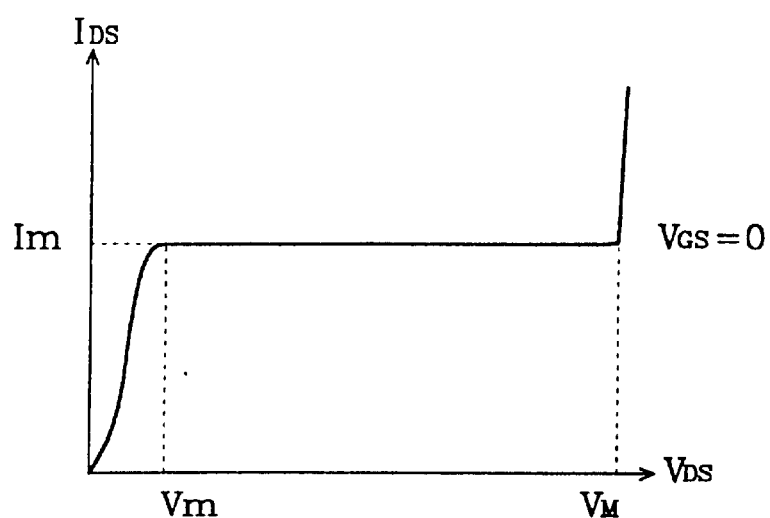
FIG. 3 represents the current-voltage curve of a component of the depleted MOS transistor type.

A depleted MOS transistor is a conventional component whose drain-source current/voltage curve is illustrated in FIG. 3. However, in conventional circuits, this component is used as a three-terminal component, the gate terminal being used to switch the MOS transistor from the on-state to the off-state. Considering the characteristic curve of FIG. 3, that corresponds to a zero gate-source voltage, that is, to a connection between the gate and the source, component 10 fully satisfies the function of a current clipping device. As long as the current that flows through the component remains lower than a value Im, the voltage drop across its terminals remains lower than a low value Vm, that is, the resistance of the component remains low. In contrast, if voltage V across the circuit of FIG. 2 increases to such an extent that the current through the load tends to exceed a value Im, this current is maintained at this value by the component and the voltage across the terminals of the component accordingly increases. Therefore, the excess of energy will be absorbed by component 10. Of course, the voltage across the component must not exceed a value corresponding to an avalanche voltage VM. Indeed, if the voltage across the component exceeds value VM, the current that flows therethrough starts increasing again, so the component goes into an avalanche mode that is liable to be damaging to the component or to the load L.

Thus, the component according to the invention is adapted to operate as a current clipping circuit in applications in which load L is liable to receive, or produce, temporary overloads, that are absorbed by component 10. It is for example the case, as indicated above, of the ballast circuit of a fluorescent lamp that tends to produce overcurrents at switching-on.

Even in this case, the heat generated in the component must be rapidly evacuated, and the limiting current must remain substantially constant as a function of the temperature. These requirements cannot be met when a MOS transistor including three electrodes that are externally connected is used.

Thus, the present invention aims at realizing a current limiting component that will be first described with relation to an exemplary specific manufacturing method such as illustrated in FIGS. 4A–4I.

Figure 4A:
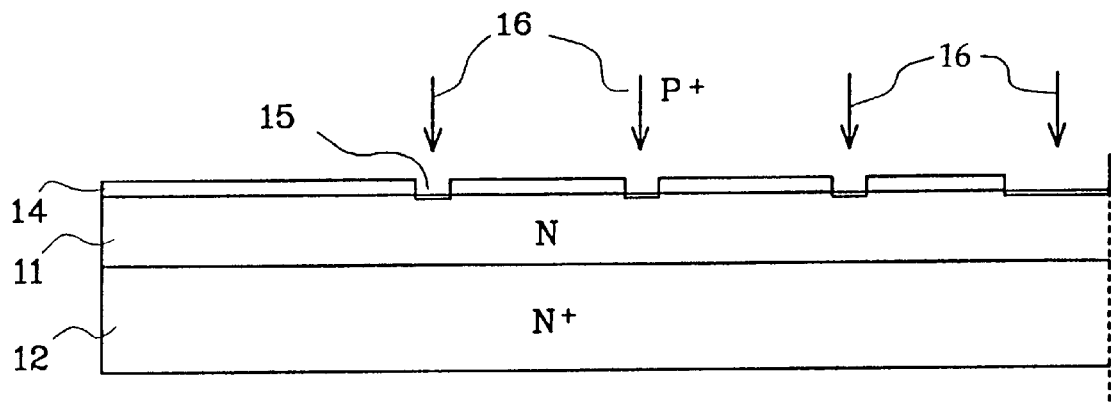
FIGS. 4A–4I are partial cross-sectional views of a component according to the invention during various manufacturing steps.

As represented in FIG. 4A, the component according to the invention is formed from a silicon wafer including a low doped layer 11 formed on a more highly doped substrate 12 of the same conductivity type, in the present case an N-type epitaxial layer on an $N^+$-type substrate. The upper surface of layer 11 is coated with an insulating layer, conventionally an oxide layer 14, having for example a 1-$\mu$m thickness, in which windows 15 are etched. Then, the upper surface is subject to ion implantation of dopants adapted to impart to the implanted areas of the substrate the P conductivity type with a high doping level ($P^+$). This ion implantation is designated by arrows 16 and corresponds, for example, to a boron implantation of a few $10^{15}$ atoms/cm$^2$ at 50 keV. Of course, the thickness of the oxide layer 14 (approximately 1 $\mu$m) is sufficient to protect the underlying areas of layer 11 from implantation effects.

Figure 4B:
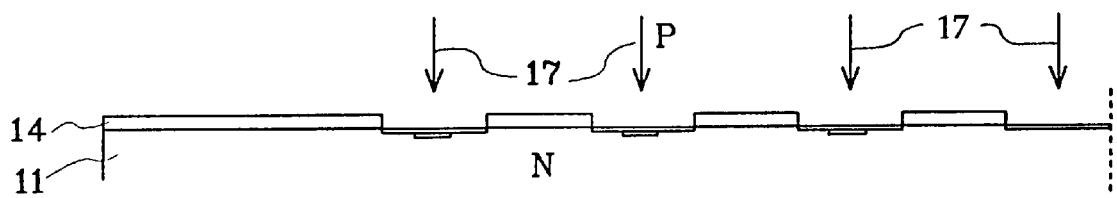

In the step illustrated in FIG. 4B, a new masking and photoetching step is carried out to widen windows 15; and P-type dopants, designated by arrows 17, are implanted. This P-type dopant implantation is similar to the $P^+$-type dopant implantation of FIG. 4A but with a smaller concentration and corresponds, for example, to a boron implantation of a few $10^{14}$ atoms/cm$^2$ at 50 keV.

Figure 4C:
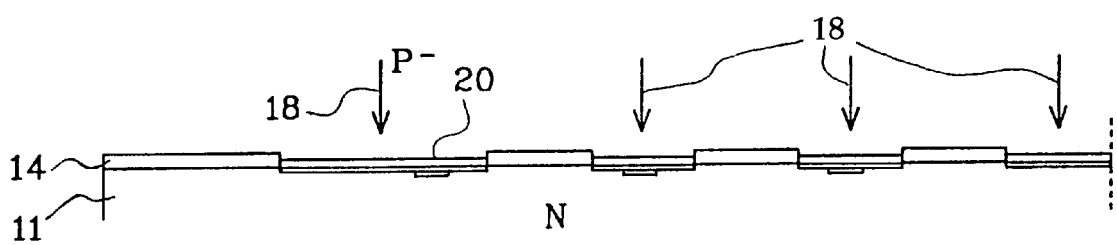

During the step of FIG. 4C, the oxide layer 14 is etched again in the vicinity of the component periphery, a pre-implantation oxidation is carried out to form a thin oxide layer 20 having, for example, a thickness of approximately 0.03 to 0.05 $\mu$m, and a $P^-$-type implantation is carried out, that is, an implantation identical to the implantation of FIGS. 4A and 4B but with a smaller concentration, as indicated by arrows 18, which corresponds for example to a boron implantation of a few $10^{12}$ atoms/cm$^2$ at 50 keV.

Figure 4D:
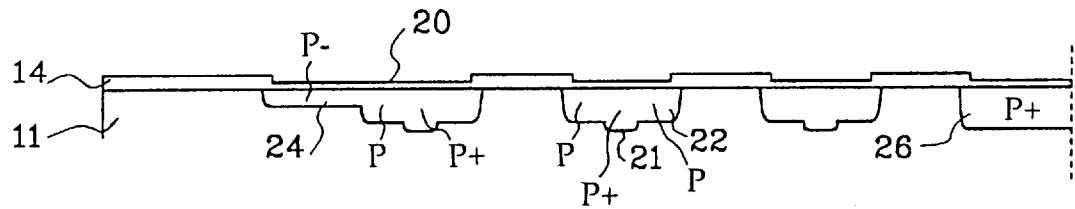

During the next step, illustrated in FIG. 4D, the component is annealed in a neutral atmosphere to diffuse the implanted dopants. Thus, one obtains P-type wells separated one from the other and including a highly doped $P^+$-type central region 21 and a lower doped P-type peripheral region 22. Regions 21 and 22 have for example respective surface doping levels of $10^{19}$ atoms/cm$^3$ and $10^{17}$ atoms/cm$^3$, respectively. FIG. 4D also represents a $P^-$-type region 24 corresponding to the implantation of FIG. 4C. Region 24 extends, as will be seen hereinafter, at the periphery of the device and is intended to improve the distribution of the electric line field and to increase the breakdown voltage of the device. Also, a $P^+$-type central region 26 serving as a contact, as will be indicated hereinafter, can be provided.

Figure 4E:
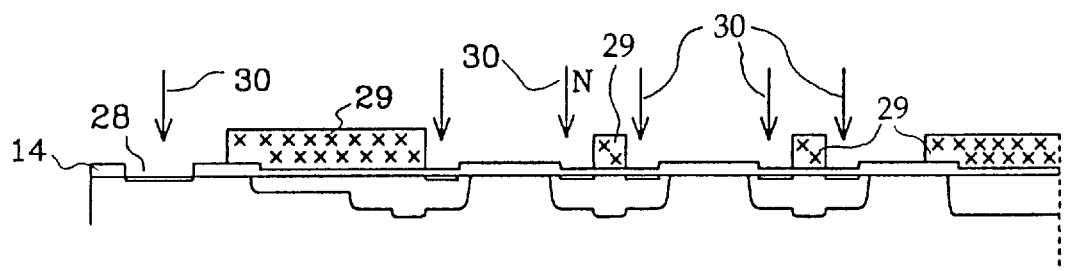

During the next step, illustrated in FIG. 4E, a window 28 is etched in the oxide layer 14 at the periphery of the component, and a photosensitive resist mask 29 is formed. Mask 29 coats the thin oxide layer formed during the step of FIG. 4C to let appear this thin oxide layer in the annular areas that are disposed at the inner periphery of each well 21-22. Then, N-type dopants are implanted at a high concentration, as indicated by arrows 30. Dopants are directly implanted in the substrate in area 28 and through the thin oxide layer 20 in the peripheral areas of each well 21-22.

Figure 4F:
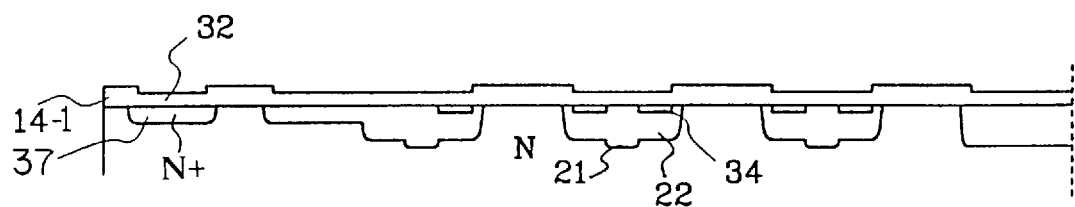

During the next step, illustrated in FIG. 4F, the component is annealed in an oxidizing atmosphere, whereby the oxide layer is thickened and a new oxide layer 32 is formed over the bare regions and the regions coated of the very thin oxide layer 20. This re-oxidation step is continued until the thickness of oxide layer 32 reaches approximately 1 $\mu$m; the oxide layer 14 reaching a thickness of approximately 1.5 $\mu$m. Thus, one obtains the structure very schematically illustrated in FIG. 4F wherein an $N^+$-type annular region 34 is formed in the upper surface of each well 21-22 (it will be noted that, during the diffusion of region 34, well 21-22 is also diffused and enlarged).

It should be noted that the outer limit of each annular region 34 is determined by the mask delineated in FIG. 4B that also serves to delineate the outer periphery of each well 22. Therefore, the outer periphery of the annular region 34 and the outer periphery of well 22 are self-aligned. The distance separating these outer peripheries, that corresponds to the channel region of a MOS transistor, is therefore precisely determined through self-alignment.

Additionally, the $N^+$-type implantation through window 28 of FIG. 4E causes the formation of an $N^+$-type peripheral region 42 that acts as a conventional stop channel.

Figure 4G:
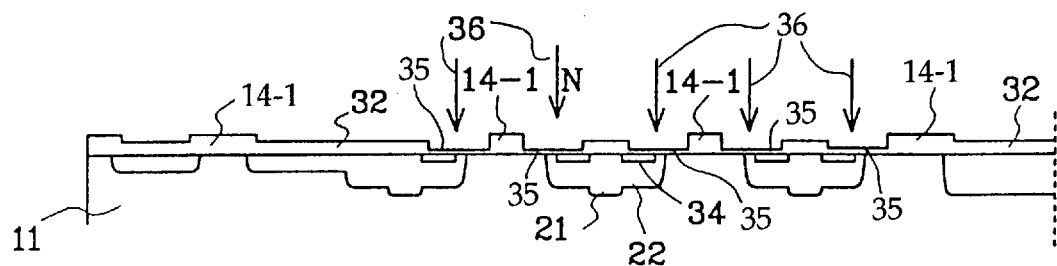

At the end of the step illustrated in FIG. 4F, a structure corresponding to the semiconductor structure of a double diffused vertical MOS transistor has been formed. This transistor is normally-OFF. As mentioned hereinabove, an object of the invention is to provide a normally-ON MOS transistor, also usually referred to as a depleted MOS transistor. To achieve this purpose, the conductivity type of the peripheral surface region of each well 22 must be inverted. This is achieved, as illustrated in FIG. 4G, by etching the oxide layer 14–32 over each region of wells 22 that is external to the annular regions 34. Preferably, oxide regions 14-1 are maintained in the middle of the portions of the substrate separating adjacent wells, and a pre-implantation thin oxide film 35 is grown. Then, an N-type dopant is implanted, as indicated by arrows 36.

Figure 4H:
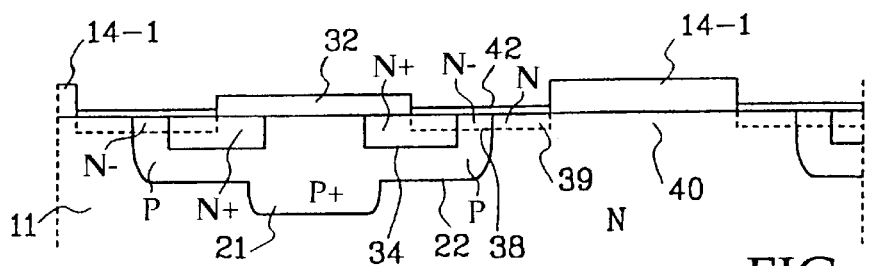

FIG. 4H shows the structure obtained after annealing and re-oxidation. FIG. 4H represents an enlarged portion of FIGS. 4A–4F in the vicinity of a MOS transistor cell. The MOS transistor cell includes the P-type well 21-22, the $N^+$-type annular region 34 and an $N^-$-type region 38 at the surface of the channel region comprised between the periphery of the annular region 34 and the periphery of well 22. This $N^-$-type region 38 results from implantation 36 that was carried out with a sufficient concentration to invert the conductivity type of region 22 and to provide it with a desired doping level to reach the desired limit current value Im.

The value Im of the limit current is expressed by the following equation:

$$Im = \mu_n C_{ox}(Z/L)(V_T)^2/2 + tm \quad (1)$$

where $\mu n$ is the electrons' mobility, $C_{ox}$ is the capacity per surface unit of the oxide gate layer 42, Z is the channel width, L is the channel length, $V_T$ is the depletion threshold voltage of the MOS transistor and is directly associated with the doping level of the channel region 38.

For example, if the surface concentration of region 22 is $10^{16}$ to $10^{17}$ atoms/cm$^3$, implantation 36 is carried out so as to impart to region 38 an N-type a doping level of approximately $3 \times 10^{16}$ to $5 \times 10^{17}$ atoms/cm$^3$.

The N-type depletion implantation overlaps the annular region 34 without substantially changing its doping level that was already approximately $10^{20}$ atoms/cm$^3$. On the other hand, the N-type depleted region also overlaps the surface portion of the epitaxial layer 11 and increases the doping level of this epitaxial layer up to the above value, whereas, inherently, this epitaxial layer has a low doping level (approximately $10^{15}$ atoms/cm$^3$). This overdoped region is labeled as 39 in FIG. 4H. Below the remaining portions 14-1 of the oxide layer 14, some regions 40 remain where the doping level of the epitaxial layer is unchanged. This disposition is advantageous in that it improves the breakdown voltage of the desired component.

Once the implantation and annealing steps are completed, an oxidation step is carried out to grow, over the channel region 38, an oxide layer 42 (thickening of layer 35) under conditions such that layer 42 reaches a desired gate insulation thickness.

Figure 4I:
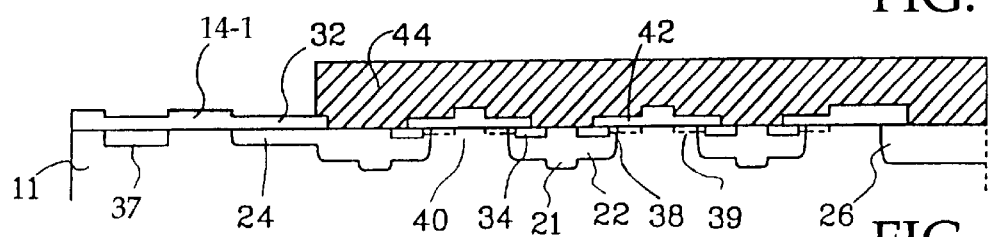

A last manufacturing step is illustrated in FIG. 4I. A masking step is carried out to coat the oxide layers 14-1, 32, 42 over central regions of each cell, to etch the upper surface of the P$^+$-type region 21 and an inner portion of the N$^+$-type annular regions 34. Then, a metallization 44 is formed (possibly by accumulation of several conductive layers). A similar metallization (not shown) is formed on the lower surface of the component. Thus, one directly obtains a two-terminal component having an upper surface metallization and a lower surface metallization, corresponding to a VDMOS depleted transistor, inherently conductive, in which the same metallization serves both as a source metallization and as a gate metallization.

A major advantage of such a structure having its upper and lower surfaces coated with a metallization is that it allows for the mounting of the component according to the invention, for example through solder-bonding, between two conductive wafers serving as heat sinks.

This component, mounted between the heat sink plates, that can in turn be associated with heat sinks, allows control of high temperatures of the component, thus ensuring steady characteristics and the possibility of using the component with relatively high power circuits.

According to an aspect of the invention, the doping level of the depleted channel 38 is selected to provide a constant or decreasing current Im when temperature increases. Indeed, from derivation of equation (1) and division by Im, taking into account that COX, Z and L are little temperature-dependent, one obtains:

$$\frac{dIm}{dT} \cdot \frac{1}{Im} = \frac{d\mu n}{dT} \cdot \frac{1}{\mu_n} + 2\frac{dV_T}{dT} \cdot \frac{1}{V_T}, \quad (2)$$

where T is the temperature.

It should be noted that $d\mu_n/dT$ is negative, and $dV_T/dT$ is positive.

For a given variation in temperature, for example for a temperature ranging from 300 to 400 K or from 300 to 450 K, $d\mu_n/\mu_n$ has a value substantially independent of the inherent features of the component, whereas $dV_T/V_T$ depends upon $V_T$, that is, mainly upon the doping level of channel 38. As shown in the following table, this doping level will be selected so that $V_T$ is comprised within 4 and 6 volts in order that the absolute value of $2dV_T/V_T$ be substantially equal to or lower than $d\mu_n/\mu_n$.

|  | T = 300–400K | T = 300–450K |
|---|---|---|
| $d\mu_n/\mu_n$ | −0.35 | −0,45 |
| $2dV_T/V_T$  $V_T$ = 2V) | 0.60 | 0.90 |
| $2dV_T/V_T$  $V_T$ = 4V) | 0.30 | 0.45 |
| $2dV_T/V_T$  $V_T$ = 6V) | 0.20 | 0.30 |

Indeed, it may be desirable that the value 0f Im decreases when the temperature increases, thus providing self-protection of the component.

Figure 5:
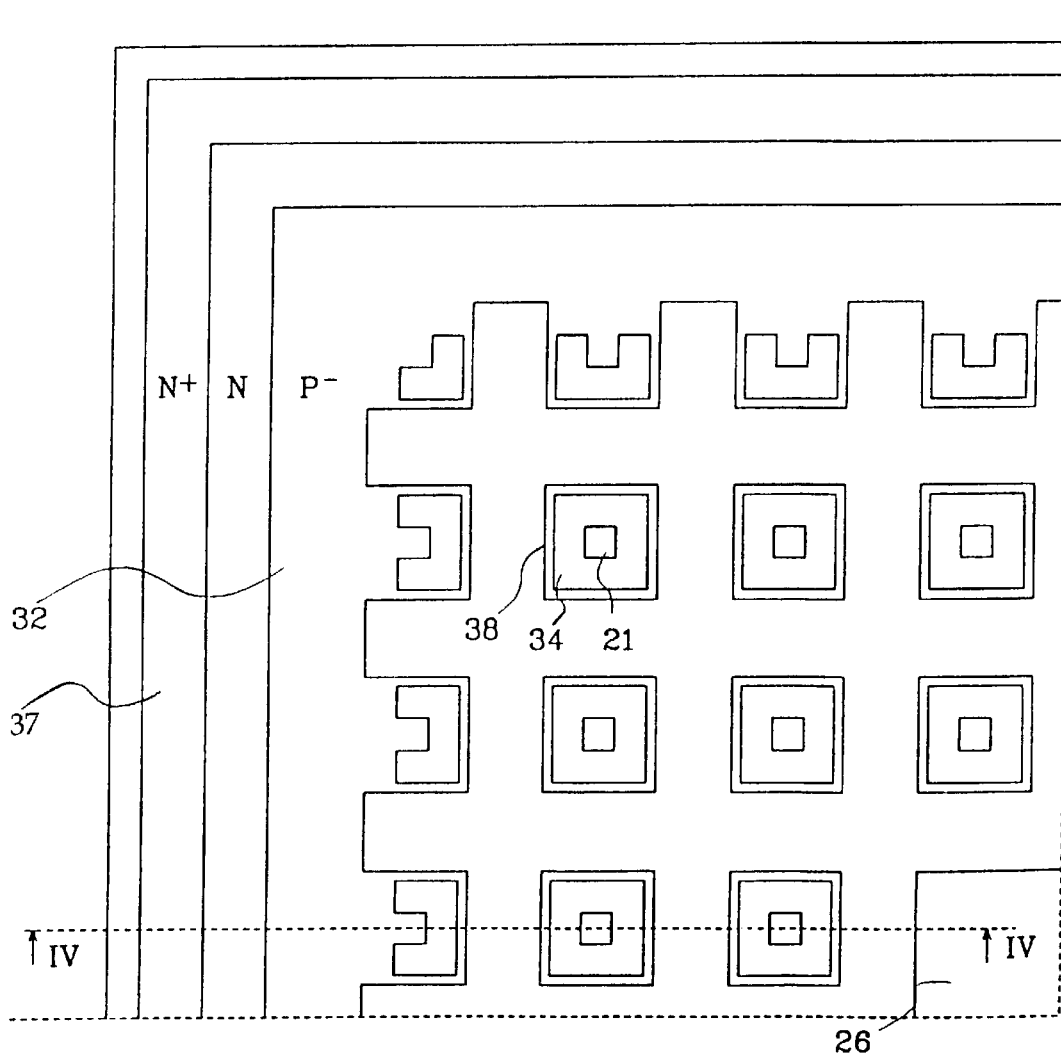
FIG. 5 is a partial top view of a component according to the invention.

FIG. 5 is a top view of such a component, which is represented in FIG. 4I as a cross-sectional view along lines IV—IV. The top view of FIG. 5 does not show the oxide layers and the metallization . In this figure, are shown the N$^+$-type peripheral stop channel region 36, the P$^-$-type region 32 for improving the field lines distribution, and the various cells are shown. FIG. 5, like FIG. 4H, shows a central region 26 that can be used to establish a connection. However, this region is optional and will not be used when the component according to the invention is mounted between two heat sinks. Similarly, regions 40 with an unchanged substrate doping level between the cells (FIGS. 4H and 4I) are not necessary and will be formed only when it is desired to increase the breakdown voltage of the component. Each cell represented in FIG. 5 can have a 50×50-μm size, and the distance between the cells can also be approximately 50 μm.

Figure 6:
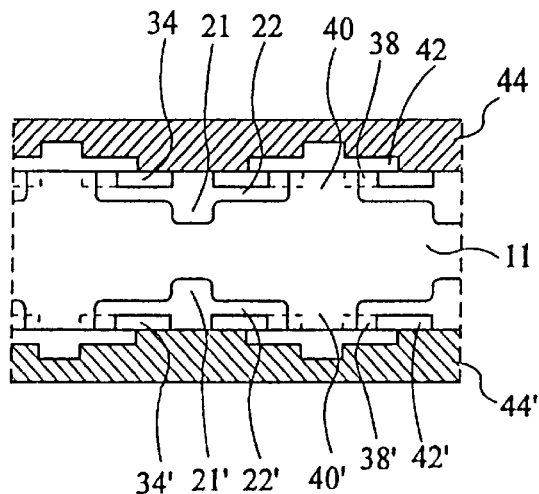
FIG. 6 is a schematic cross-sectional view of a bidirectional current limiting component according to the invention.

FIG. 6 is a schematic cross-sectional view of a bidirectional current limiting component according to the invention. In FIG. 6, the upper portion of the substrate is similar to the portion illustrated in FIG. 4I and the various regions and layers are labeled with same reference numerals. In addition, similar regions and layers are symmetrically formed from the upper surface of the substrate and are labeled with same prime references. Thus, a two-terminal bidirectional current limiting component is provided, that operates as an IGBT component in each polarity (refer to the last paragraphs of the present description).

Figure 7:
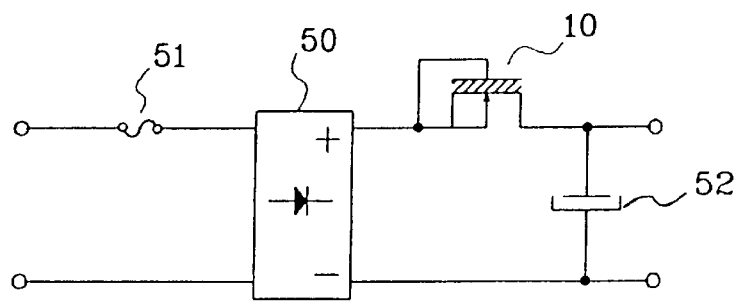
FIG. 7 illustrates an exemplary application of a component according to the invention.

FIG. 7 represents an exemplary use of a current clipping component according to the invention. In FIG. 7, a rectifying bridge 50 is fed through an a.c. voltage source, for example 220 volts, a fuse 51 being provided in the a.c. circuit. The d.c. supply voltage terminals of the rectifying bridge 50 are connected to a load circuit (not shown) in parallel with a capacitor 52. The current clipping circuit 10 according to the invention is disposed between the positive terminal of the rectifying bridge and the positive terminal of capacitor 52.

Figure 8:
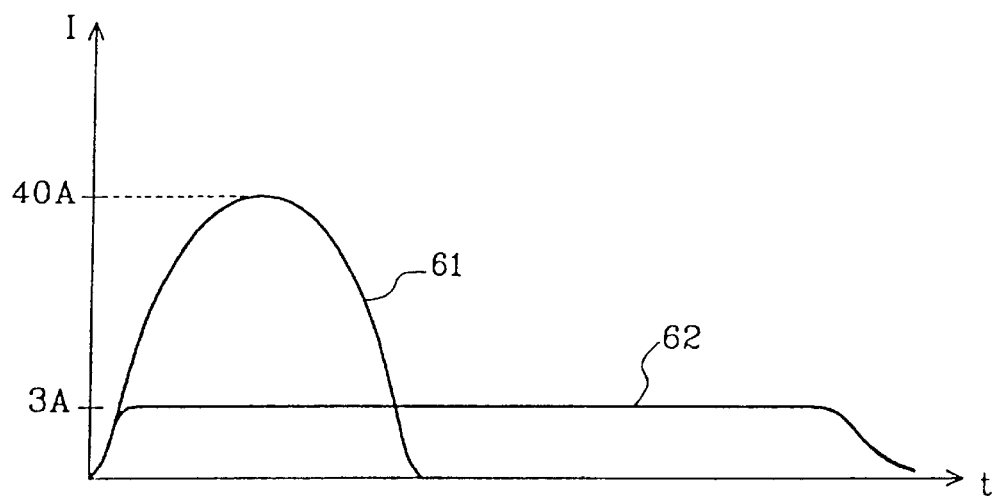
FIG. 8 are current timing diagrams useful for explaining the operation of the circuit of FIG. 7.

As shown in FIG. 8, at switching-on the current through capacitor 52 should follow curve 61, in the absence of the current clipping circuit 10, that is should rapidly increase up to a value of approximately 40 amperes, then drop when capacitor 52 is charged. By using the component 10 according to the invention, having for example a current Im of approximately 3 amperes, a regulated charge according to curve 62 is obtained, and the high peak-on current is avoided. In this example, component 10 initially sees across its terminals substantially the whole d.c. voltage from the rectifying bridge 50. So, this component must be devised to withstand across its terminals a voltage higher than 300 volts. For this component, a value Vm (refer to FIG. 3) of approximately 400 volts, for example, will be chosen.

Two specific features of the component according to the illustrated embodiment of the invention should be noted:

the self-alignment of the masks defining the channel length over a thick oxide layer whereas, in a conventional MOS transistor, the self-alignment masks are formed from a gate metallization ("metallization" can be a polycrystalline silicon layer); and the use of a single gate and source metallization whereas, in a conventional MOS transistor, two distinct metallizations are used even if the transistor is used in a circuit having interconnected gate and source.

As is apparent to those skilled in the art, various modifications can be made to the above disclosed embodiments, more particularly for the nature of the dopants used and of the metallization materials. Similarly, the doping levels, the sizes of the cells and of the whole component will be chosen as a function of the required performances. Those skilled in the art will also select the type of casing to be used as a function of the required thermal dissipation performance.

Additionally, in the above description, the component 10 according to the invention has been described as being a VDMOS-type transistor with interconnected gate and source. As is known, an IGBT, that is, a component having a structure identical to that of a vertical MOS transistor but with a highly doped rear surface, of a doping type opposite to that of the substrate, obtained for example from an N-type epitaxial growth over a P$^+$-type substrate, has operating characteristics similar to those of a vertical MOS transistor. If the various doping levels, and the sizes of the cells are optimized, one obtains, for an IGBT, a current-voltage value very close to the value obtained for a VDMOS transistor, but with a reduced resistance under normal operating conditions. This characteristic is particularly advantageous for high-voltage devices for which the resistance of the epitaxial layer imposes a non-negligible resistance at the conductive state (for values lower than value Vm indicated in FIG. 3).

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method for manufacturing a two-terminal component in a substrate of the first conductivity type, including the following steps:

forming, through a first mask, wells of the second conductivity type having walls therebetween;

forming, in each of said wells, by using the first mask and an additional mask, annular regions of the second conductivity type;

implanting a dopant of the first conductivity type by using a third mask that does not cover a peripheral portion of each of the wells between an outer portion and the annular region, to invert the conductivity type of said peripheral region;

growing an oxide layer having a predetermined thickness for gate insulation;

etching the oxide layers over a central portion of each of the wells, including an inner portion of each annular region;

forming a continuous metallization to form both an oxide-isolated gate over the oxide layer and a source contact over the central portions of each well, the gate and the source held thereby at substantially equal voltages; and forming a metallization on the rear surface.

2. The method of claim 1, wherein said third mask includes portions for protecting intermediate areas of the substrate between adjacent walls between the wells.

3. The method of claim 1, wherein the doping level of the dopant of the first conductivity type is selected so that a limitation current defined by the component has a value that is substantially constant when temperature varies, while a channel length is selected so as to obtain a desired value for the limitation current.

4. A method of fabricating a two-terminal component constituting a depletion type MOS or IGBT transistor of a vertical double-diffused type wherein a source and a gate of the transistor are made of a single continuous metallization which holds the gate and the source at substantially equal voltages, and wherein a depleted channel region results from an implantation of a first conductivity type formed in a peripheral region of a second conductivity type, so that a doping level of the depleted channel region of the first conductivity type is such that a limitation current of the component has a value that is substantially constant when temperature varies.

5. The method of claim 4, wherein a length of the depleted channel region is selected so as to obtain a desired value for the limitation current.

6. A method for manufacturing a two-terminal component according to claim 5, in a substrate of the first conductivity type, including the following steps:

forming, through a first mask, wells of the second conductivity type having walls therebetween;

forming, in each of said wells, by using the first mask and an additional mask, annular regions of the second conductivity type;

implanting a dopant of the first conductivity type by using a third mask that does not cover a peripheral portion of each of the wells between an outer portion and the annular region, to invert the conductivity type of said peripheral region;

growing an oxide layer having a predetermined thickness for gate insulation;

etching the oxide layer over a central portion of each of the wells, including an inner portion of each annular region;

forming a continuous metallization to form both an oxide-isolated gate over the oxide layer and a source contact over the central portions of each well the gate and source held thereby at substantially equal voltages; and forming a metallization on the rear surface.

7. The method of claim 6, wherein said third mask includes portions for protecting intermediate areas of the substrate between adjacent walls between the wells.

\* \* \* \* \*